(12) United States Patent
Yeh (10) Patent No.: US 10,885,811 B2
(45) Date of Patent: Jan. 5, 2021

(54) METHOD OF USING HAND-MADE CIRCUIT BOARD FOR LEARNING

(71) Applicant: AIDMICS BIOTECHNOLOGY (HK) CO., LIMITED, Wanchai (HK)

(72) Inventor: Chang-Ching Yeh, Wanchai (HK)

(73) Assignee: Aidmics Biotechnology (HK) Co., Limited, Wanchai (HK)

( * ) Notice: Subject to any disclaimer, the term of this patent is extended or adjusted under 35 U.S.C. 154(b) by 0 days.

(21) Appl. No.: 16/859,641

(22) Filed: Apr. 27, 2020

(65) Prior Publication Data
US 2020/0258423 A1 Aug. 13, 2020

Related U.S. Application Data

(63) Continuation of application No. 15/983,543, filed on May 18, 2018.

(51) Int. Cl.
*H05K 1/02* (2006.01)
*H05K 1/09* (2006.01)
(Continued)

(52) U.S. Cl.
CPC ......... *G09B 23/183* (2013.01); *A63H 33/042* (2013.01); *A63H 33/26* (2013.01);
(Continued)

(58) Field of Classification Search
CPC .. H05K 1/02; H05K 1/09; H05K 1/16; H05K 1/18; H05K 1/183; H05K 1/189;
(Continued)

(56) References Cited

U.S. PATENT DOCUMENTS 4,233,382 A * 11/1980 Edwards ................ G03G 19/00
346/74.3
5,137,542 A * 8/1992 Buchanan .............. B24D 11/00
252/502

(Continued)

FOREIGN PATENT DOCUMENTS

| CN | 101621894 A | 1/2010 |
| CN | 104436638 A | 3/2015 |

(Continued)

*Primary Examiner* — Xiaoliang Chen
(74) *Attorney, Agent, or Firm* — Muncy, Geissler, Olds & Lowe, P.C.

(57) ABSTRACT

A method of using a hand-made circuit board for learning includes: providing a hand-made circuit board which comprises a substrate; and a medium layer disposed on a surface of the substrate to form a pattern, wherein the medium layer has a notably paintable non-conductive zone configured with a plurality of electrical blocks, and the electrical blocks are discontinuously distributed in the notably paintable non-conductive zone, so that the electrical blocks on at least one cross-section of the notably paintable non-conductive zone are not electrically connected; and drawing a drawn conductive layer on the notably paintable non-conductive zone of the pattern by an end user, wherein the drawn conductive layer has conductive particles linking the electrical particle blocks in the notably paintable non-conductive zone, thereby electrically connecting the electrical particle blocks to complete a circuit line.

10 Claims, 7 Drawing Sheets

(51) Int. Cl.

| | | |
|---|---|---|
| *H05K 1/16* | (2006.01) | |
| *H05K 1/18* | (2006.01) | |
| *H05K 3/10* | (2006.01) | |
| *H05K 3/30* | (2006.01) | |
| *H01L 23/00* | (2006.01) | |
| *H01L 23/52* | (2006.01) | |
| *H01L 23/538* | (2006.01) | |
| *G09B 23/18* | (2006.01) | |
| *A63H 33/26* | (2006.01) | |
| *A63H 33/04* | (2006.01) | |
| *G09B 19/00* | (2006.01) | |
| *F21V 33/00* | (2006.01) | |
| *F21V 19/00* | (2006.01) | |
| *H05K 1/03* | (2006.01) | |
| *H05K 3/12* | (2006.01) | |
| *F21W 121/00* | (2006.01) | |
| *F21Y 113/13* | (2016.01) | |
| *F21Y 115/10* | (2016.01) | |

(52) U.S. Cl.
CPC ........ *F21V 19/0015* (2013.01); *F21V 33/008* (2013.01); *G09B 19/0069* (2013.01); *H05K 1/0386* (2013.01); *H05K 1/097* (2013.01); *H05K 1/181* (2013.01); *H05K 3/1275* (2013.01); *H05K 3/305* (2013.01); *F21W 2121/00* (2013.01); *F21Y 2113/13* (2016.08); *F21Y 2115/10* (2016.08); *H05K 2201/09281* (2013.01); *H05K 2201/10037* (2013.01); *H05K 2201/10053* (2013.01); *H05K 2201/10083* (2013.01); *H05K 2201/10106* (2013.01); *H05K 2203/0126* (2013.01)

(58) Field of Classification Search
CPC ............ H05K 3/10; H05K 3/30; H05K 3/105; H05K 3/225; H01L 23/00; H01L 23/52; H01L 23/538
USPC ......... 362/382; 174/250, 257, 260; 257/678; 361/313; 29/825
See application file for complete search history.

(56) References Cited

U.S. PATENT DOCUMENTS

| | | | |
|---|---|---|---|
| 5,242,511 A | 9/1993 | Yokoyama | |
| 5,892,668 A | 4/1999 | Okamoto | |
| 5,920,454 A * | 7/1999 | Nomura | H05K 1/162 361/313 |
| 6,297,652 B1 | 10/2001 | Shimoda | |
| 7,836,935 B2 | 11/2010 | Bunt | |
| 9,011,762 B2 | 4/2015 | Seppa | |
| 9,545,043 B1 | 1/2017 | Hamilton | |
| 2003/0035917 A1 | 2/2003 | Hyman | |
| 2004/0084759 A1* | 5/2004 | Miyagawa | H05K 1/189 257/678 |
| 2005/0080183 A1 | 4/2005 | Chung | |
| 2006/0072944 A1* | 4/2006 | Sharma | G03G 15/6585 399/308 |
| 2007/0040245 A1 | 2/2007 | Seno | |
| 2007/0059503 A1 | 3/2007 | Park | |
| 2007/0110973 A1 | 5/2007 | Hiraoka | |
| 2007/0193026 A1* | 8/2007 | Dong | H01L 21/4867 29/825 |
| 2008/0117238 A1 | 5/2008 | Sekiya | |
| 2009/0071703 A1 | 3/2009 | Lmahori | |
| 2009/0220771 A1 | 9/2009 | Fleming | |
| 2009/0242855 A1 | 10/2009 | Fleming | |
| 2009/0258241 A1 | 10/2009 | Shiraishi | |
| 2009/0263162 A1* | 10/2009 | Sharma | H05K 3/207 399/237 |
| 2011/0088935 A1 | 4/2011 | Ishimatsu | |
| 2011/0186340 A1 | 8/2011 | Kuramoto | |
| 2012/0152593 A1 | 6/2012 | Nakaone | |
| 2012/0168206 A1 | 7/2012 | Sekine | |
| 2012/0212904 A1 | 8/2012 | Fleminq | |
| 2012/0231178 A1 | 9/2012 | Svasand | |
| 2013/0099666 A1 | 4/2013 | Stuffle | |
| 2013/0213788 A1 | 8/2013 | Tanabe | |
| 2013/0335940 A1 | 12/2013 | Matsui | |
| 2014/0022812 A1 | 1/2014 | Andrich | |
| 2015/0021070 A1* | 1/2015 | Nakamura | H05K 3/225 174/257 |
| 2015/0092429 A1 | 4/2015 | Speer | |
| 2015/0216037 A1 | 7/2015 | Tomita | |
| 2015/0330610 A1 | 11/2015 | Song | |
| 2015/0353234 A1 | 12/2015 | Yagishita | |
| 2016/0095200 A1 | 3/2016 | Au | |
| 2016/0344089 A1 | 11/2016 | Baik | |
| 2017/0006710 A1 | 1/2017 | Diana | |
| 2017/0103959 A1 | 4/2017 | Akutsu | |
| 2018/0140992 A1 | 5/2018 | Chang | |

FOREIGN PATENT DOCUMENTS

| | | |
|---|---|---|
| JP | 59-113686 A | 6/1984 |
| JP | S63-00189 | 1/1988 |
| JP | 2006261303 A | 9/2006 |
| JP | 2015185212 A | 10/2015 |
| JP | 2016129173 A | 7/2016 |

* cited by examiner

METHOD OF USING HAND-MADE CIRCUIT BOARD FOR LEARNING

CROSS REFERENCE TO RELATED APPLICATIONS

This Non-provisional application is a continuation application of U.S. application Ser. No. 15/983,543. This and all other extrinsic materials discussed herein are incorporated by reference in their entirety.

BACKGROUND

Technology Field

This disclosure relates to a hand-made circuit board containing conductive zone and/or non-conductive zone.

Description of Rotated Art

The circuit board has a main function of providing the electrical connections for the components disposed on the circuit board. For different requirements, the circuit board can be a product with the light, thin, compact, soft, and/or hard properties. Generally, the circuit board can be a single-layer board, a double-layer board, or a multilayer board. In practice, the printed circuit boards have been widely used in various electrical products and daily necessities, such as computers, computer peripheral apparatuses, communication devices, or the likes.

However, the manufacturing of the printed circuit board includes a plurality of steps, such as cutting a substrate, preparing a circuit layout, transfer printing the circuit layout to the substrate by a photoresist or printing method, exposure, developing and etching. This manufacturing needs many equipment and the acidic or alkali toxic solution (e.g. the developing solution or the etching solution), so the manufacturing of circuit boards is not easy. Besides, according to the above reasons, it is improper to manufacture the printed circuit boards under a normal environment. In general, the professional operators are needed to operate the equipment for manufacturing the printed circuit boards in the factory or lab. In other words, the nonprofessional users cannot easily perform the above steps for manufacturing the circuit boards. In particular, for the education purpose, the students who have never touched the circuits (e.g. young users) do not have the ability to participate the manufacturing of the circuit boards.

Therefore, it is desired to provide a circuit board for the nonprofessional users or young users. The users who have never touched circuits or circuit boards can still set the desired circuit layout by themselves following the guidance of the medium layer of the circuit board. This configuration can make the manufacturing of circuit boards easier, so that the general users can also create a circuit board just like a professional operator. Thus, the manufacturing of circuit boards becomes more flexible. Besides, the users can easily have fun in the preparation of circuit layout and circuit boards. Moreover, the users can put the manufactured circuit board on a construction assembly (e.g. a stereo tree house) for providing the sound, light and magnet functions. It can be applied to the education field and provide the joy of assembling and learning.

SUMMARY

In view of the foregoing, an objective of this disclosure is to provide a hand-made circuit board, which has a medium layer for guiding the users to create the desired circuit layout, conducting the circuits, and making the desired circuit board by themselves. This configuration can allow the users to manufacturing the circuit board easily just like a professional operator. Thus, the manufacturing of circuit boards becomes more flexible, and the users can easily have fun in the preparation of circuit layout and circuit boards.

In order to achieve the above objective, the present disclosure provides a hand-made circuit board, which includes a substrate and a medium layer disposed on a surface of the substrate to form a pattern. The medium layer has a non-conductive zone configured with a plurality of electrical blocks. The electrical blocks are discontinuously distributed in the non-conductive zone, so that the electrical blocks on at least one cross-section of the non-conductive zone are not electrically connected.

In one embodiment, the medium layer further has a conductive zone configured with a plurality of electrical blocks, and the electrical blocks are continuously distributed in the conductive zone, so that the electrical blocks on at least one cross-section of the conductive zone are electrically connected.

In one embodiment, the electrical blocks are conductive blocks, conductive wires, conductive sheets, conductive inks, conductive tapes, semi-conductive materials, or any combination thereof.

In one embodiment, the non-conductive zone or the conductive zone is a resistance-adjustable zone.

In one embodiment, the substrate is a wood substrate, a bamboo substrate, a paper substrate, a cotton substrate, a high-density fiber substrate, a resin substrate, or any combination thereof.

In one embodiment, the substrate comprises a coating layer disposed on the surface of the substrate, and the medium layer is disposed on the coating layer.

In one embodiment, the hand-made circuit board further includes at least an electro-induced change element electrically connected to the medium layer.

In one embodiment, the electro-induced change element is a light-emitting unit, a heating unit, a sound unit, an electrochromic unit, a magnetic unit, or any combination thereof.

In one embodiment, the electro-induced change element is a light-emitting unit, and the light-emitting unit is made by hands.

In one embodiment, the light-emitting unit includes an electrical substrate, a light-emitting diode, and a flexible patch. The electrical substrate is electrically connected to the medium layer. The light-emitting diode is electrically connected to the electrical substrate. The flexible patch flatly attaches to or surrounds the electrical substrate and the light-emitting diode, so that the electrical substrate and the light-emitting diode are electrically and firmly connected to each other.

In one embodiment, the electrical block includes graphite, graphene, silver, copper, gold, aluminum, tungsten, alloys thereof, or conductive metal oxides thereof.

In one embodiment, the hand-made circuit board further includes a battery and a switch unit. The battery is disposed on the surface of the substrate, and one end of the battery is electrically connected to the medium layer. The switch unit is adjustably and electrically connected between the battery and the medium layer.

To achieve the above objective, the disclosure also provides a hand-made circuit board, which includes a substrate and a medium layer disposed on a surface of the substrate to form a pattern. The medium layer has a conductive zone configured with a plurality of electrical blocks. The electrical blocks are continuously distributed in the conductive zone, so that the electrical blocks on at least one cross-section of the conductive zone are electrically connected.

In one embodiment, the medium layer further has a non-conductive zone configured with a plurality of electrical blocks, and the electrical blocks are discontinuously distributed in the non-conductive zone, so that the electrical blocks on at least one cross-section of the non-conductive zone are not electrically connected.

In one embodiment, the electrical blocks are conductive blocks, conductive wires, conductive sheets, conductive inks, conductive tapes, semi-conductive materials, or any combination thereof.

In one embodiment, the non-conductive zone or the conductive zone is a resistance-adjustable zone.

In one embodiment, the substrate is a wood substrate, a bamboo substrate, a paper substrate, a cotton substrate, a high-density fiber substrate, a resin substrate, or any combination thereof.

In one embodiment, the substrate comprises a coating layer disposed on the surface of the substrate, and the medium layer is disposed on the coating layer.

In one embodiment, the hand-made circuit board further includes at least an electro-induced change element electrically connected to the medium layer.

In one embodiment, the electro-induced change element is a light-emitting unit, a heating unit, a sound unit, an electrochromic unit, a magnetic unit, or any combination thereof.

In one embodiment, the electro-induced change element is a light-emitting unit, and the light-emitting unit is made by hands.

In one embodiment, the light-emitting unit includes an electrical substrate, a light-emitting diode, and a flexible patch. The electrical substrate is electrically connected to the medium layer. The light-emitting diode is electrically connected to the electrical substrate. The flexible patch flatly attaches to or surrounds the electrical substrate and the light-emitting diode, so that the electrical substrate and the light-emitting diode are electrically and firmly connected to each other.

In one embodiment, the electrical block includes graphite, graphene, silver, copper, gold, aluminum, tungsten, alloys thereof, or conductive metal oxides thereof.

In one embodiment, the hand-made circuit board further includes a battery and a switch unit. The battery is disposed on the surface of the substrate, and one end of the battery is electrically connected to the medium layer. The switch unit is adjustably and electrically connected between the battery and the medium layer.

As mentioned above, the present disclosure provides a hand-made circuit board, which includes a substrate and a medium layer disposed on a surface of the substrate to form a pattern. The medium layer has a non-conductive zone configured with a plurality of electrical blocks. The electrical blocks are discontinuously distributed in the non-conductive zone, so that the electrical blocks on at least one cross-section of the non-conductive zone are not electrically connected. Moreover, the medium layer has a conductive zone configured with a plurality of electrical blocks, and the electrical blocks are continuously distributed in the conductive zone, so that the electrical blocks on at least one cross-section of the conductive zone are electrically connected. Based on the design of the medium layer, the general users can be guided to create the desired circuit layout, conducting the circuits, and making the desired circuit board by themselves. This configuration can allow the users to manufacturing the circuit board easily just like a professional operator. Thus, the manufacturing of circuit boards becomes more flexible, and the users can easily have fun in the preparation of circuit layout and circuit boards. In addition, the users can put the manufactured circuit board on a construction assembly (e.g. a stereo tree house) for providing the sound, light and magnet functions. It can be applied to the education field and provide the joy of assembling and learning.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
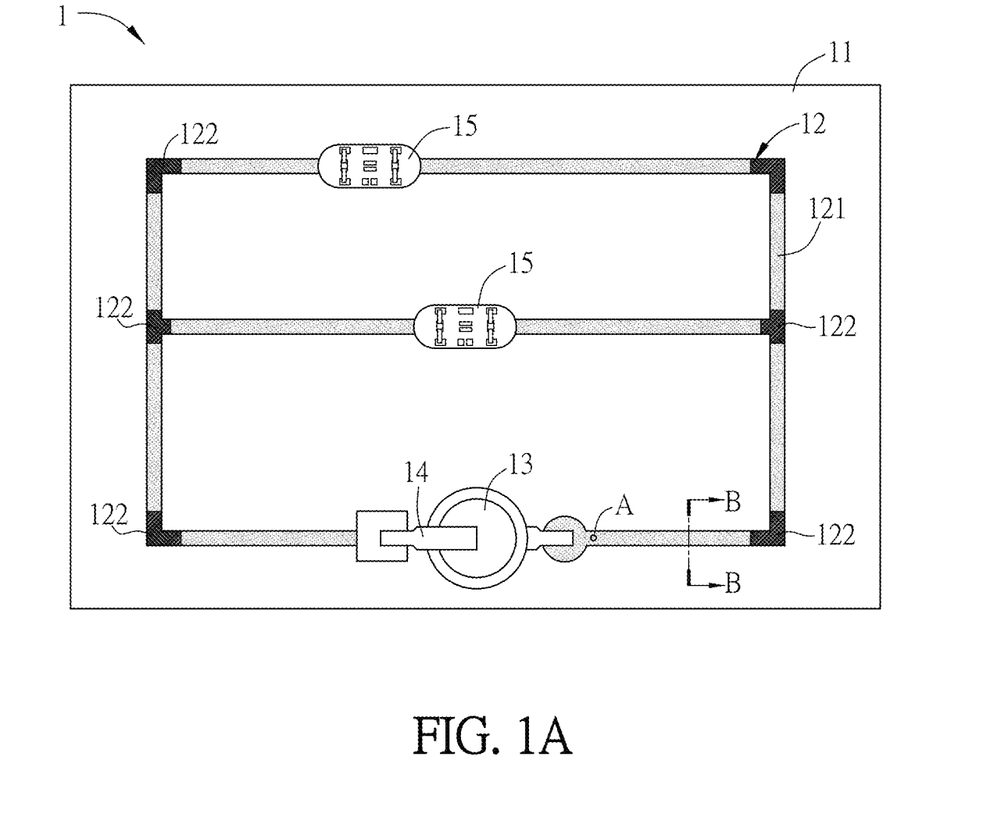
FIG. 1A is a schematic diagram showing a hand-made circuit board according to an embodiment of this disclosure.
Figure 1B:
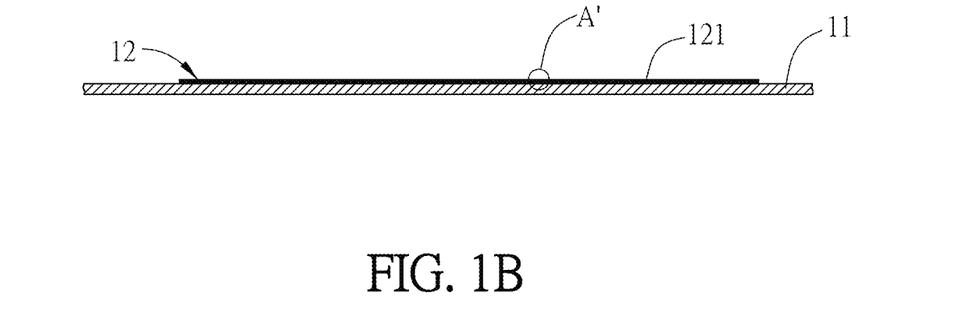
FIG. 1B is a sectional view of the hand-made circuit board of FIG. 1A along the line B-B.
Figure 1C:
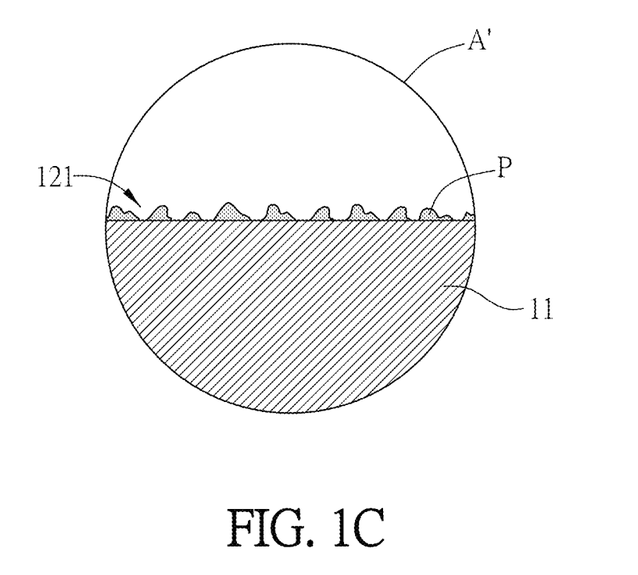
FIG. 1C is a schematic diagram showing an enlarged view of the sectional area A' of FIG. 1B.
Figure 1D:
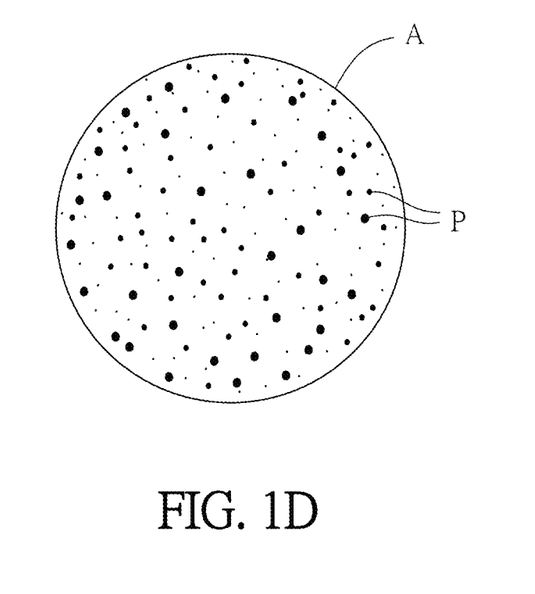
FIG. 1D is a schematic diagram showing an enlarged view of the area A of the medium layer as shown in FIG. 1A.
Figure 1E:
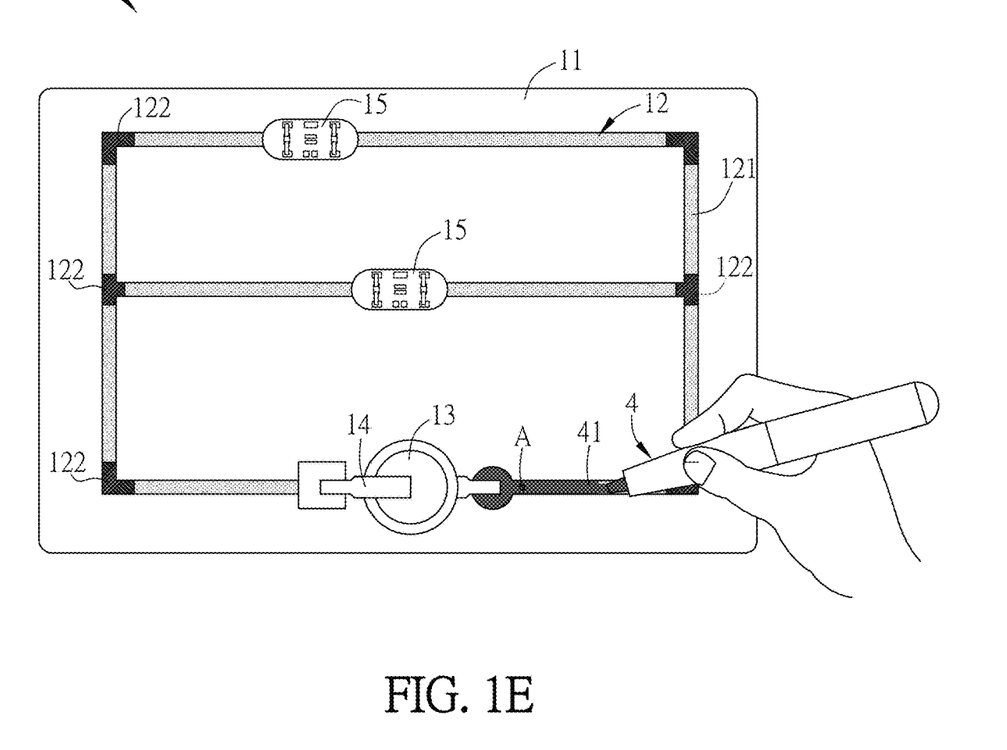
FIG. 1E is a schematic diagram showing the distribution of the electrical blocks in the non-conductive zone of FIG. 1A, wherein the distributed electrical blocks is increasing.
Figure 1F:
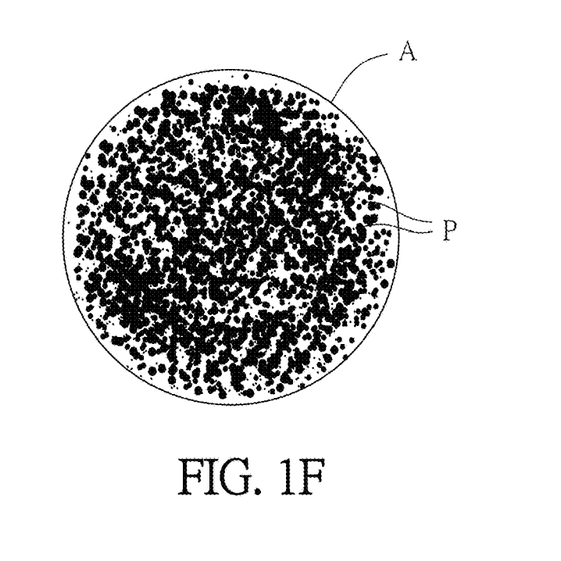
FIG. 1F is a partial enlarged diagram of the area A of the medium layer as shown in FIG. 1E.

FIG. 1A is a schematic diagram showing a hand-made circuit board according to an embodiment of this disclosure. FIG. 1B is a sectional view of the hand-made circuit board of FIG. 1A along the line B-B. FIG. 1C is a schematic diagram showing an enlarged view of the sectional area A' of FIG. 1B. FIG. 1D is a schematic diagram showing an enlarged view of the area A of the medium layer as shown in FIG. 1A. FIG. 1E is a schematic diagram showing the distribution of the electrical blocks in the non-conductive zone of FIG. 1A, wherein the distributed electrical blocks is increasing. FIG. 1F is a partial enlarged diagram of the area A of the medium layer as shown in FIG. 1E.

Referring to FIGS. 1A and 1B, the hand-made circuit board 1 includes a substrate 11 and a medium layer 12. In addition, the hand-made circuit board 1 further includes a battery 13, a switch unit 14, and two electro-induced change elements 15. To be noted, the hand-made circuit board 1 of this embodiment can be applied in the education field. For example, the nonprofessional users or young users can follow the guidance of the medium layer 12 of the hand-made circuit board 1 so as to create the desired circuit layout, conduct the circuits, and make the desired circuit board by themselves. Of course, in other embodiments, the hand-made circuit board 1 can be used in other fields (e.g. science and research fields), and this disclosure is not limited.

In this embodiment, the substrate 11 includes a coating layer (not shown), and the coating layer is disposed on the surface of the substrate 11. The medium layer 12 is disposed on the surface of the substrate 11 (on the coating layer). In other words, the coating layer is disposed between the substrate 11 and the medium layer 12. Different the substrate of the conventional printed circuit board, the substrate 11 of the hand-made circuit board 1 can be, for example but not limited to, a wood substrate, a bamboo substrate, a paper substrate, a cotton substrate, a high-density fiber substrate, a resin substrate, or any combination thereof. Herein, the substrate 11 is an insulation substrate, which is different from the common substrate for the conventional printed circuit board including aluminum substrate, iron substrate, paper phenol copper laminated substrate, paper epoxy copper laminated substrate, glass-epoxy copper laminated substrate, glass composite copper laminated substrate, glass-epoxy substrate or glass-phenyl resin substrate.

The medium layer 12 is disposed on the surface (or the coating layer) of the substrate 11 and forms a pattern. The medium layer 12 has a non-conductive zone 121 configured with a plurality of electrical blocks P (see FIG. 1C). The electrical blocks P can be conductive blocks, conductive wires, conductive sheets, conductive inks, conductive tapes, semi-conductive materials, or any combination thereof. In addition, the electrical block P includes graphite, graphene, silver, copper, gold, aluminum, tungsten, alloys thereof, or conductive metal oxides thereof. Ideally, the electrical blocks P in the non-conductive zone 121 are optionally the electrical blocks containing silver nano-particles, so that the hand-made circuit board 1 can have a better electrical conductivity. In addition, the electrical blocks P can be optionally made of another metal material or nonmetal material. For example, the electrical blocks P can be made of a cheaper metal material, so that the manufacturing cost of the hand-made circuit board 1 can be reduced. In addition, the electrical blocks P can be thinner graphene conductive blocks, so that the hand-made circuit board 1 can be thinner.

In this embodiment, the coating layer of the substrate 11 is a polymer coating layer, which can provide a better surface roughness. Accordingly, in the hand-made circuit board 1, the user can easily use the conductive ink pen 4 to apply the conductive material on the medium layer 12, and the circuit characteristics of the painted circuit can be more stable. In other words, the configuration of the polymer coating layer can help the conductive material (e.g. silver paste or silver nano-particles 41) of the conductive ink pen 4 to be properly attached onto the non-conductive zone 121 of the medium layer 12. The attached conductive material will not be lost easily, so the circuit of the hand-made circuit board 1 is more stable (see FIG. 1E). For example, the substrate 11 of this embodiment is a planar photo paper card having a good surface roughness. In other embodiments, the coating layer can be removed, and the medium layer 12 is directly disposed on the substrate 11.

Referring to FIG. 1A, the medium layer 12 has a pattern containing two consecutive rectangles. Accordingly, the electrical blocks P of the medium layer 12 are correspondingly arranged within the two consecutive rectangles. In other words, the circuit layout of the hand-made circuit board 1 has a shape containing two consecutive rectangles. In other embodiments, the medium layer 12 may also have other patterns, such as a polygon, concentric circles, a spiral, a star or an irregular shape. In addition, the irregular shape can be a pattern of an animal, a fruit, a star, or any favorite figure that can attract the attention of young user and make the young user have fun.

In practice, the conductive material (e.g. conductive ink) can be applied on the substrate 11 by a printing unit or a transfer printing unit so as to form a coating layer, thereby forming the medium layer 12 having the electrical blocks P. In general, the conductive ink is a water-based or alcohol-based solution, which contains silver nano-particles, solvent (water or alcohol), surfactant, dispersion stabilizer and other additives. The conductive ink can be printed on the medium layer 12 to form any desired pattern by the digital ink printing or 3D printing method.

As shown in FIG. 1A, the medium layer 12 and the non-conductive zone 121 formed on the substrate 11 is shown as a shallow gray area. In other embodiments, the medium layer 12 may further include a plurality of sub-patterns, and at least a part of the sub-patterns are not connected with each other. The sub-patterns can be dots, strips (see FIG. 2A), dotted lines, arrows, or mosaics. According to this design, the sub-patterns of the medium layer 12 can present a unique and attractive figure.

As shown in FIG. 1A, the battery 13 and the switch unit 14 can form a control assembly for controlling to turn on/off the hand-made circuit board 1. The battery 13 is disposed on the surface of the substrate 11, and one end of the battery 13 is electrically connected to the medium layer 12. The switch unit 14 is adjustably connected between the battery 13 and the medium layer 12. In practice, the battery 13 can be optionally the small-sized button cell battery for implementing the compact hand-made circuit board 1 along with the thin substrate 11. In addition, the switch unit 14 can be formed by silver foil or copper foil, and the user can fold the silver foil or copper foil to prepare the switch unit 14. Accordingly, the user can further participate the manufacturing of the hand-made circuit board 1, and have fun in the manufacturing process. After folding the silver foil or copper foil, the user can simply press the switch unit 14 to electrically connect the battery 13 and the medium layer 12.

Besides, the hand-made circuit board 1 further includes at least one electro-induced change element 15, which is disposed on the substrate 11 and electrically connected to the medium layer 12. The electro-induced change element 15 can be a light-emitting unit, a heating unit, a sound unit, an electrochromic unit, a magnetic unit, or any combination thereof. For example, the electro-induced change element 15 can be an LED, a heater, a speaker or buzzer, a photochromic sheet, an electromagnet, or any combination thereof. Thus, after being switched on, the electro-induced change element 15 can enable the hand-made circuit board 1 to generate light, heat, sound, color change, or magnet. In this embodiment, the electro-induced change element 15 includes two light-emitting units (e.g. LED). Herein, the two LEDs are connected to the medium layer 12 (including two consecutive rectangles) in parallel. When the electrical blocks P have electrical conductivity after turning on the switch unit 14, the two LEDs can emit light. If the hand-made circuit board 1 is installed in another construction assembly or education material, the hand-made circuit board 1 can be used as the lighting component of the construction assembly. For example, the hand-made circuit board 1 can be used as the roof of a house model, so that the roof of the house model can emit light.

In addition, the electro-induced change element 15 can be optionally selected based on the requirement of different education purposes. For example, in other embodiments, the electro-induced change element 15 can optionally include a light-emitting unit and a sound unit (e.g. an LED and a speaker). In this case, the hand-made circuit board 1 can output light and sound after turning on the switch unit 14 to conducting the electrical blocks P. Moreover, the LEDs of different colors can be selected, so that the hand-made circuit board 1 can output the colorful light. These designs can be applied to other construction assembly or education material and increase the product satisfaction.

In the application of the hand-made circuit board 1, the medium layer 12 and the non-conductive zone 121 are functioned as the circuit layout of the hand-made circuit board 1. To be noted, the electrical blocks P in the non-conductive zone 121 are electrically connected to conduct the medium layer 12 under a special condition only. The conducting status is related to the operation of the user.

As shown in FIGS. 1C and 1D, the area A' of FIG. 1C and the area A of FIG. 1D include a plurality of electrical blocks P. In the area A of FIG. 1D, the electrical blocks P only occupy a less part of the non-conductive zone 121. As shown in FIG. 1D, the electrical blocks P are discontinuously distributed on the surface of the substrate 11 (saw shape), so that the electrical blocks P on the cross-section of the nonconductive zone 121 (along the line B-B of FIG. 1A) are not electrically connected. To be noted, this disclosure only discusses the cross-section A of FIG. 1A and the area A' of the cross-section along the line B-B of FIG. 1A, but this disclosure is not limited thereto. Similarly, the electrical blocks P in other area of the non-conductive zone 121 and the other cross-sections of FIG. 1A also have discontinuous distribution. In other words, when the electrical blocks P on the cross-section of the non-conductive zone 121 are discontinuously distributed, the electrical blocks P are not electrically connected. Briefly, the electrical conductivity of the medium layer 12 is related to the continuous or discontinuous distribution of the electrical blocks P in the non-conductive zone 121.

In order to assign the medium layer 12 with electrical conductivity, a conductive layer can be provided on the non-conductive zone 121, so that the electrical blocks P in the non-conductive zone 121 can be electrically connected. Thus, the medium layer 12 can have electrical conductivity. As shown in FIG. 1E, the user can use a conductive ink pen 4 or conductive marker to draw a conductive layer on the medium layer 12. Since the conductive ink pen 4 contains silver nano-particles 41 or silver ink, the drawn conductive layer (containing the silver nano-particles 41) can link the discontinuous electrical blocks P in the non-conductive zone 121, thereby electrically connecting the discontinuous electrical blocks P. Accordingly, the medium layer 12 can be provided with the desired electrical conductivity. In this embodiment, the material of the silver nano-particles 41 is the same as the material of the electrical blocks P.

FIG. 1F is a partial enlarged diagram of the area A of the medium layer 12, which is drawn with the conductive layer by the conductive ink pen 4. The distribution of the electrical blocks P in the non-conductive zone 121 as shown in FIG. 1F is obviously increased than the distribution in FIG. 1D. Since the distribution of the electrical blocks P increases, the electrical blocks P will become the continuous distribution in the cross-section and be electrically connected. In brief, after the user follows the guidance the medium layer 12 to draw the electrical blocks P on the medium layer 12 with the conductive ink pen 4 containing the silver nano-particles 41, the electrical blocks P on the cross-section of the non-conductive zone 121 become a continuous distribution. Thus, the electrical blocks P can be electrically connected and the medium layer 12 is provided with the electrical conductivity, so that the hand-made circuit board 1 of FIG. 1E can be conducted.

Thus, the user can use the conductive ink pen 4 to draw the circuit layout on the medium layer 12 according to the guidance of the medium layer 12, so that the medium layer 12 can have electrical conductivity. In addition, according to the material of the substrate 11 and the drawing speed of the user, the user can draw circuit lines with different lengths. Besides, based on the surface roughness of the substrate 11, the effective distance of the drawn circuit lines can be different. For example, if the substrate 11 has a rough surface, the lengths of the drawn circuit lines are shorter. In this embodiment, the substrate 11 of the hand-made circuit board 1 is a smooth photo paper card and has a coating layer, so lengths of the drawn circuit lines are longer. This configuration can sufficiently increase the efficiency and lifetime of the conductive ink pen 4. Moreover, on the photo paper card as the substrate 11, the drawn wrong circuit can be erased, and the electrical blocks P can have better electrical conductivity.

To be noted, as shown in FIGS. 1A and 1E, the medium layer 12 can further include a conductive zone 122, which can also be applied with a coating layer. The conductive zone 122 also includes a plurality of electrical blocks P, which are continuously distributed, so that the electrical blocks P on at least one cross-section of the conductive zone 122 are electrically connected. In specific, the conductive zone 122 is a low resistance zone, and the resistance value of the conductive zone 122 can be optionally adjusted based on the requirement of the user. The configuration of the conductive zone 122 allows the user to draw the desired conductive layer on the medium layer 12 with the conductive ink pen 4 or conductive marker, thereby preventing the open circuit of the medium layer 12. In other embodiments, the non-conductive zone 121 is a high resistance zone, and the resistance value of the non-conductive zone 121 can also be optionally adjusted based on the requirement of the user. For example, the user can repeatedly draw a circuit line with the conductive ink pen 4 or conductive marker, so that the distribution density of the electrical blocks P in this drawn area can be increased, thereby reducing the resistance value of the conductive zone 122. In addition, the user may reduce the repeated lines drawn on the medium layer 12, so that the conductive zone 122 can be maintained at a high resistance value. Accordingly, the user can optionally control the resistance value of the conductive zone or non-conductive zone, and the adjustment and switching between the conducting and non-conducting modes. Moreover, the medium layer 12 of the hand-made circuit board 1 may include eight one or both of the non-conductive zone 121 and the conductive zone 122, and this disclosure is not limited.

As mentioned above, the hand-made circuit board 1 of the present disclosure includes a substrate 11 and a medium layer 12 disposed on a surface of the substrate 11 to form a pattern. The medium layer 12 has a non-conductive zone 121 configured with a plurality of electrical blocks P. The electrical blocks P are discontinuously distributed in the non-conductive zone 121, so that the electrical blocks P on at least one cross-section of the non-conductive zone 121 are not electrically connected. Moreover, the medium layer 12 has a conductive zone 122 configured with a plurality of electrical blocks P, and the electrical blocks P are continuously distributed in the conductive zone 122, so that the electrical blocks P on at least one cross-section of the conductive zone 122 are electrically connected. In addition, the coating layer of the substrate 11 has good surface roughness, so that the silver nano-particles 41 of the conductive ink pen 4 can be easily disposed on the medium layer 12, and the drawn circuit pattern and the entire circuit can be more stable. Accordingly, the general users can following the guidance of the medium layer 12 to create the desired circuit on the medium layer 12, so the electrical blocks P can be continuously distributed and electrically connected. Based on the design of the medium layer 12, the general users can be guided by the medium layer 12 to create the desired circuit layout, conduct the circuits, and make the desired circuit board by themselves. This configuration can allow the users to manufacturing the circuit board easily just like a professional operator. Thus, the manufacturing of circuit boards becomes more flexible, and the users can easily have fun in the preparation of circuit layout and circuit boards.

In addition, the medium layer of the hand-made circuit board 1 can have some different aspects cooperating with the above substrate 11.

Figure 2A:
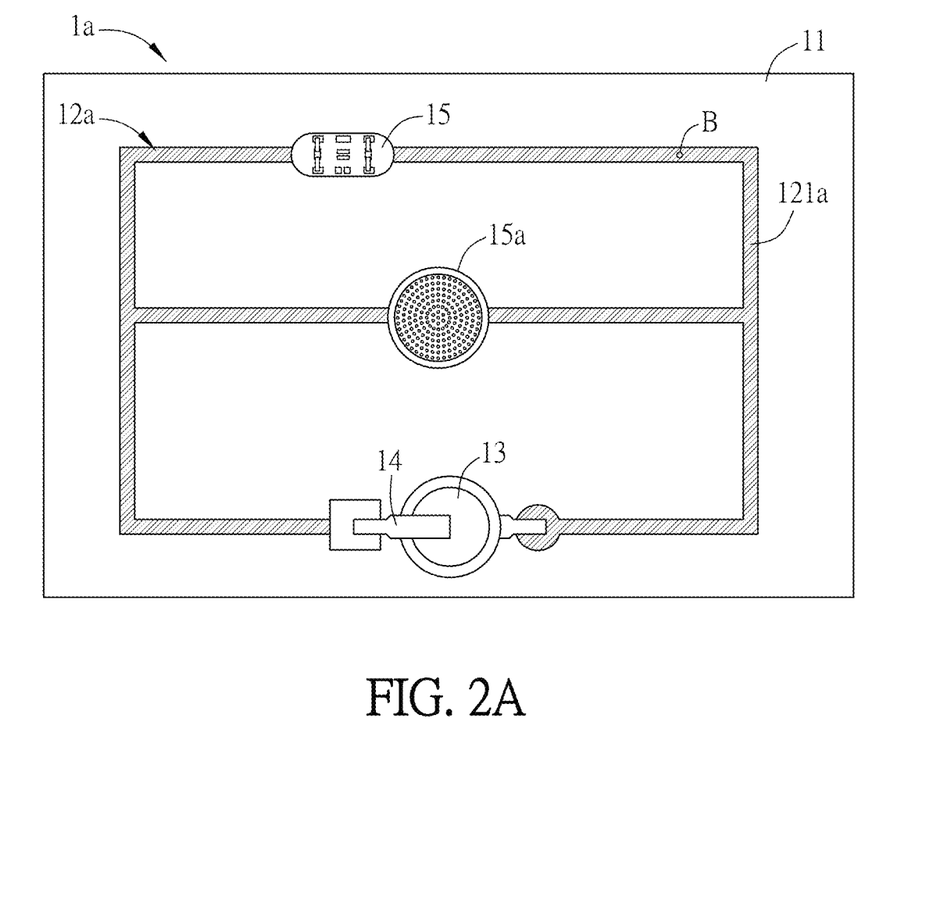
FIG. 2A is a schematic diagram showing a hand-made circuit board according to another embodiment of this disclosure.
Figure 2B:
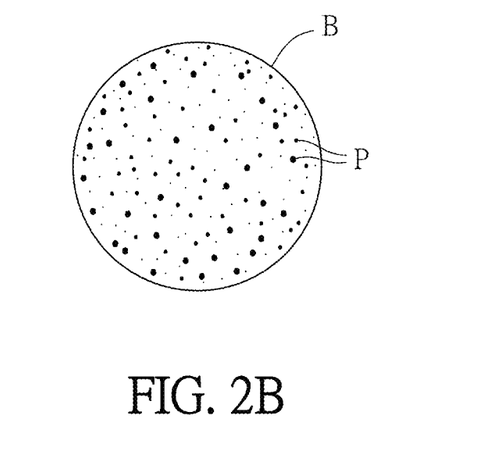
FIG. 2B is a partial enlarged diagram of the area B of the medium layer as shown in FIG. 2A.

FIG. 2A is a schematic diagram showing a hand-made circuit board according to another embodiment of this disclosure, and FIG. 2B is a partial enlarged diagram of the area B of the medium layer as shown in FIG. 2A.

The components and relations between the components of the hand-made circuit board 1a of FIG. 2A are mostly the same as those of the hand-made circuit board 1 of the previous embodiment. Similarly, the hand-made circuit board 1a of this embodiment also has a pattern containing two consecutive rectangles. Different from the hand-made circuit board 1, the medium layer 12a of the hand-made circuit board 1a includes a plurality of electrical blocks P configured as a plurality of stripes (sub-patterns). As shown in FIG. 2B, the area B of FIG. 2A includes a plurality of electrical blocks P, and the electrical blocks P are arranged as a plurality of sub-patterns including a plurality of stripes. Accordingly, the user can follow the guidance of the medium layer 12a (the stripe sub-patterns) and draw the desired circuit layout on the medium layer 12a (painting the silver nano-particles 41 by the conductive ink pen 4). This drawing step can increase the area percentage of the electrical blocks P in the non-conductive zone 121a. Since the electrical blocks P has a continuous distribution on the cross-section of the non-conductive zone 121a, they can be electrically connected so as to provide the medium layer 12a with electrical conductivity.

The design of stripe sub-patterns can provide a unique style for the medium layer 12a of the hand-made circuit board 1a, which has a better attraction to the users. Besides, in this embodiment, the electro-induced change element 15 is a light-emitting unit, and the electro-induced change element 15a is a sound unit. For example, the electro-induced change elements 15 and 15a can include an LED and a speaker. Accordingly, when the medium layer 12a becomes electrical conductive, the hand-made circuit board 1a can output light and sound. Thus, the construction assembly or education material containing the hand-made circuit board 1a can improve the product satisfaction of the user.

The other technical features of the hand-made circuit board 1a can be referred to the hand-made circuit board 1 of the previous embodiment, so the detailed descriptions thereof will be omitted.

In addition, the user can made a light-emitting unit by hands and assemble the hand-made light-emitting unit to the medium layer of the hand-made circuit board of this disclosure.

Figure 3A:
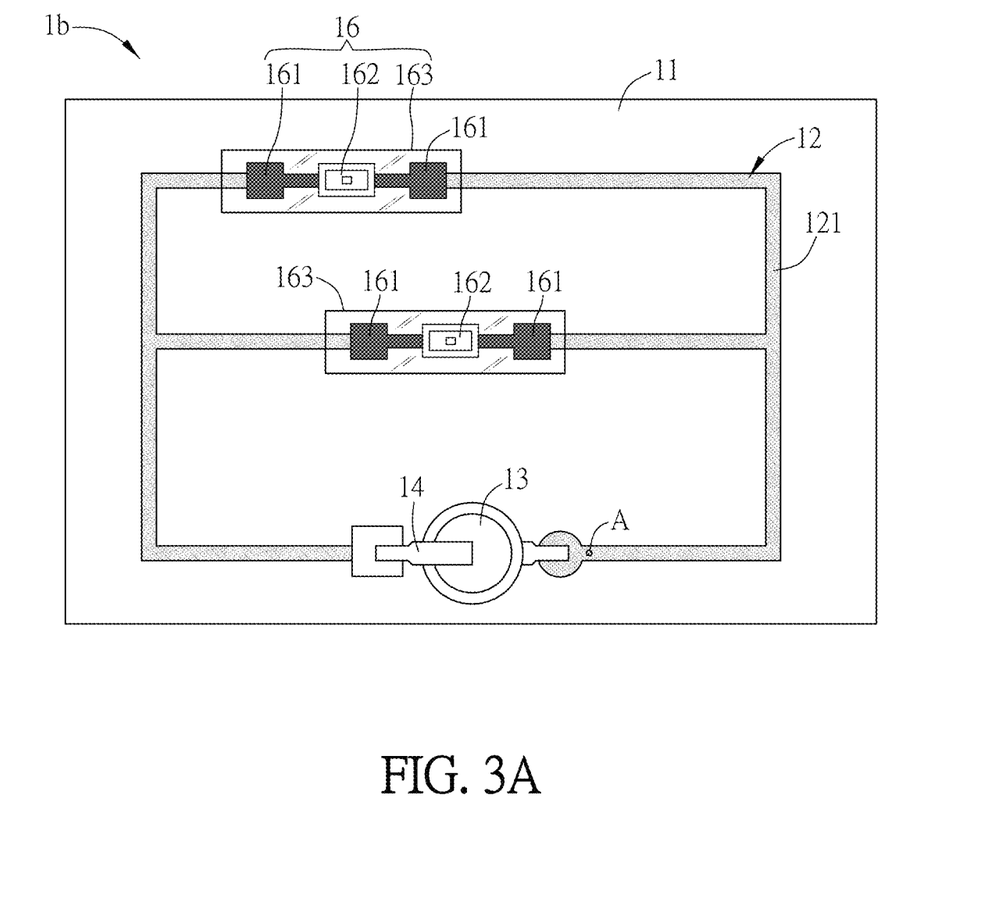
FIG. 3A is a schematic diagram showing a hand-made circuit board according to another embodiment of this disclosure.
Figure 3B:
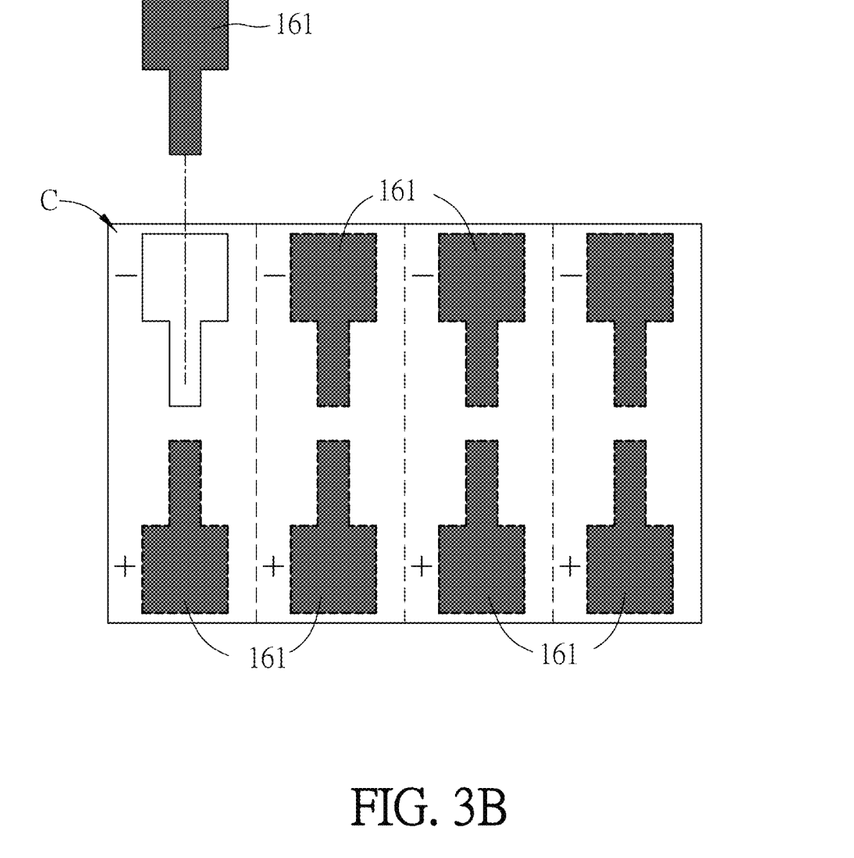
FIG. 3B is a schematic diagram showing the hand-made circuit board of FIG. 3A, wherein the electrical substrate is disposed on a paper card.

FIG. 3A is a schematic diagram showing a hand-made circuit board according to another embodiment of this disclosure, and FIG. 3B is a schematic diagram showing the hand-made circuit board of FIG. 3A, wherein the electrical substrate is disposed on a paper card. Referring to FIGS. 3A and 3B, the components and relations between the components of the hand-made circuit board 1b of FIG. 3A are mostly the same as those of the hand-made circuit board 1 of the previous embodiment. In this embodiment, the electro-induced change element is a light-emitting unit 16. Different from the above electro-induced change elements, the light-emitting unit 16 of the hand-made circuit board 1b is made by the user manually.

Referring to FIG. 3A, the light-emitting unit 16 includes an electrical substrate 161, a light-emitting diode 162, and a flexible patch 163. In more specific, the electrical substrate 161 includes electrical blocks similar to the structure of the medium layer 12. Before the user applies the silver nano-particles 41 of the conductive ink pen 4 or the electrical conductive layer on the electrical substrate 161, the electrical substrate 161 does not have the electrical conductivity. In this embodiment, the electrical substrate 161 can be a wood substrate, a bamboo substrate, a paper substrate, a cotton substrate, a high-density fiber substrate, a resin substrate, or any combination thereof. The conductive material of the electrical substrate 161 is similar to the material of the medium layer 12, such as graphite, graphene, silver, copper, gold, aluminum, tungsten, alloys thereof, or conductive metal oxides thereof. Moreover, the electrical substrate 161 is electrically connected to the medium layer 12.

In addition, the light-emitting diode 162 is electrically connected to the electrical substrate 161. The flexible patch 163 flatly attaches to or surrounds the electrical substrate 161 and the light-emitting diode 162, so that the electrical substrate 161 and the light-emitting diode 162 are electrically and firmly connected to each other. In this embodiment, the flexible patch 163 is a tape for fastening the electrical substrate 161 and the light-emitting diode 162. In other embodiments, the flexible patch 163 can be a double-sided adhesive or sticker for fixing the electrical substrate 161 and the light-emitting diode 162.

As shown in FIG. 3B, the electrical substrate 161 is disposed in a paper card C in advance. Two sides of the electrical substrate 161 (the paper card) are labeled with a cathode and an anode, respectively. One paper card C can be configured with a plurality of electrical substrates 161, and a dotted line is printed on the paper card C between two adjacent electrical substrates 161. According to the above design, the user can cut the paper card C along the dotted lines to obtain one electrical substrate 161. In this embodiment, the paper card C is configured with four electrical substrates 161. In other embodiments, the paper card C can be configured with more or less electrical substrates 161. In the procedure for manufacturing the light-emitting unit 16 manually, the electrical substrate 161 and the medium layer 12 of the circuit board 1b are contacted with each other, and then the light-emitting diode 162 is disposed between two electrical substrates 161. The light-emitting diode 162 is electrically connected to the two electrodes (anode and cathode) of the electrical substrate 161. Then, the flexible patch 163 is provided to wrap or fix the light-emitting diode 162 on the electrical substrate 161 and the hand-made circuit board 1b.

To be noted, in the procedure for manufacturing the electrical substrate 161 manually, the user must cut off the redundant part of the paper card other than the desired electrical substrate 161, so that the electrical substrate 161 can be perfectly electrically connected with the medium layer 12 of the circuit board 1b. Besides, the electrical substrate 161 can also have sub-patterns similar to those of the above medium layer 12 (e.g. the shallow gray area or the stripe sub-patterns). In this embodiment, the hand-made electrical substrate 161 has sub-patterns of shallow gray areas. Accordingly, the user can follow the guidance of the electrical substrate 161 and the medium layer 12 and draw the desired circuit layout on the medium layer 12 and the electrical substrate 161. This drawing step can increase the area percentage of the electrical blocks P in the non-conductive zone 121 and the electrical substrate 161. Since the electrical blocks P has a continuous distribution on the cross-section of the non-conductive zone 121, they can be electrically connected so as to electrically conduct the medium layer 12 with the electrical substrate 161, thereby enabling the light-emitting unit 16 to emit light. In this embodiment, the electrical substrate 161 for enabling the light-emitting diode 162 to emit light is made by hands, so that the user can further enjoy the procedures for assembling the light-emitting unit 16 and operating the hand-made circuit board 1b.

The other technical features of the hand-made circuit board 1b can be referred to the hand-made circuit board 1 of the previous embodiment, so the detailed descriptions thereof will be omitted.

Figure 4:
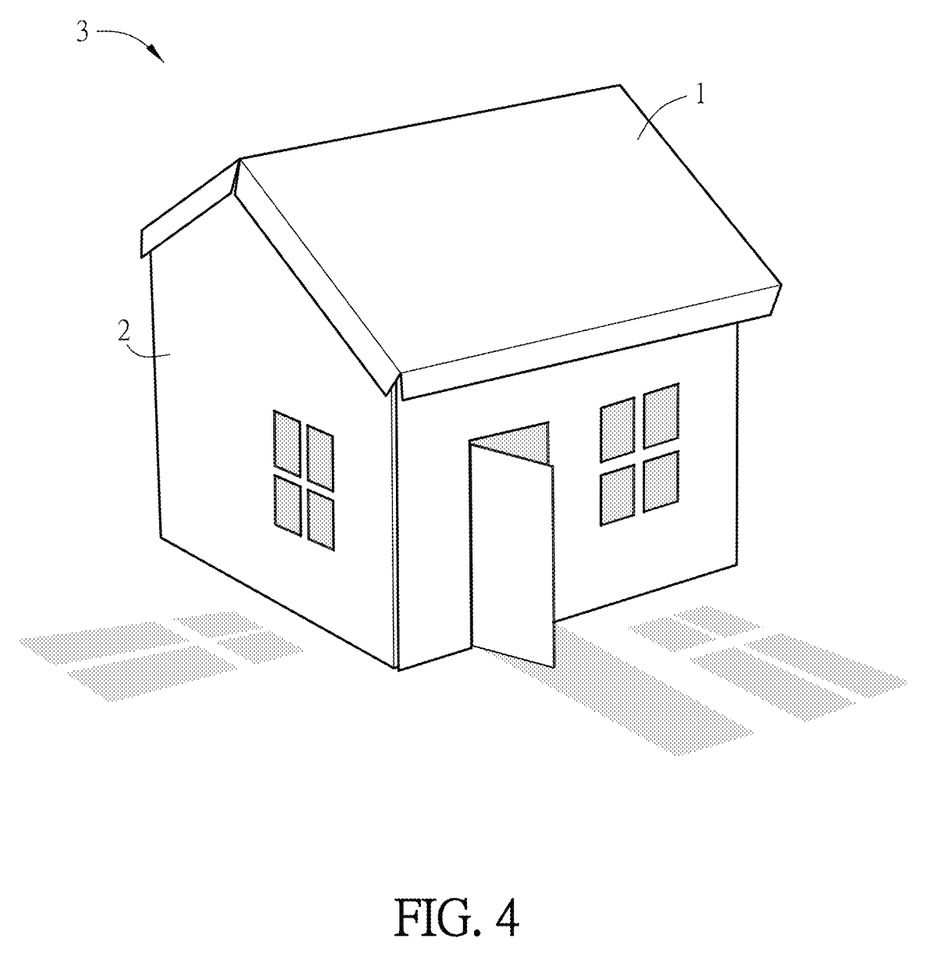
FIG. 4 is a schematic diagram showing that the hand-made circuit board of the embodiment is disposed on a construction assembly.

FIG. 4 is a schematic diagram showing that the hand-made circuit board of the embodiment is disposed on a construction assembly 3. As shown in FIG. 4, the construction assembly 3 includes a construction member 2. For example, the hand-made circuit board 1 is disposed in the construction member 2 of the construction assembly 3. The construction assembly 3 can be a model made by the user, such as a puzzle paper house (e.g. a tree house), a woody puzzle dinosaur, or a toy car. The hand-made circuit board 1 can be installed in the construction assembly 3 for functioning as a lighting unit or a sound-light unit. For example, the hand-made circuit board 1 can be arranged on the roof of the construction assembly 3, so that the roof of the construction assembly 3 can emit light.

In summary, the present disclosure provides a hand-made circuit board, which includes a substrate and a medium layer disposed on a surface of the substrate to form a pattern. The medium layer has a non-conductive zone configured with a plurality of electrical blocks. The electrical blocks are discontinuously distributed in the non-conductive zone, so that the electrical blocks on at least one cross-section of the non-conductive zone are not electrically connected. Moreover, the medium layer can have a non-conductive zone and a conductive zone configured with a plurality of electrical blocks. The electrical blocks are continuously distributed in the conductive zone, so that the electrical blocks on at least one cross-section of the conductive zone are electrically connected. Based on the design of the medium layer, the general users can be guided to create the desired circuit layout, conducting the circuits, and making the desired circuit board by themselves. This configuration can allow the users to manufacturing the circuit board easily just like a professional operator. Thus, the manufacturing of circuit boards becomes more flexible, and the users can easily have fun in the preparation of circuit layout and circuit boards. In addition, the users can put the manufactured circuit board on a construction assembly (e.g. a stereo tree house) for providing the sound, light and magnet functions. It can be applied to the education field and provide the joy of assembling and learning.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of using a hand-made circuit board for learning, comprising:
   providing a hand-made circuit board which comprises a substrate and a medium layer disposed on a surface of the substrate to form a pattern, wherein the medium layer has a notably paintable non-conductive zone configured with a plurality of electrical blocks, and the electrical blocks are discontinuously distributed in the notably paintable non-conductive zone, so that the electrical blocks on at least one cross-section of the notably paintable non-conductive zone are not electrically connected; and
   drawing a drawn conductive layer on the notably paintable non-conductive zone of the pattern by an end user, wherein the drawn conductive layer has conductive particles linking the electrical particle blocks in the notably paintable non-conductive zone, thereby electrically connecting the electrical particle blocks to complete a circuit line.

2. The method according to claim 1, wherein the medium layer further has a conductive zone configured with a plurality of electrical blocks, and the electrical blocks are continuously distributed in the conductive zone, so that the electrical blocks on at least one cross-section of the conductive zone are electrically connected.

3. The method according to claim 2, wherein the notably paintable non-conductive zone or the conductive zone is a resistance-adjustable zone.

4. The method according to claim 1, wherein the electrical blocks are conductive blocks, conductive wires, conductive sheets, conductive inks, conductive tapes, semi-conductive materials, or any combination thereof.

5. The method according to claim 1, wherein the notably paintable non-conductive zone or the conductive zone is a resistance-adjustable zone.

6. The method according to claim 1, wherein the hand-made circuit board further comprises:
   at least an electro-induced change element electrically connected to the medium layer.

7. The method according to claim 6, wherein the electro-induced change element is a light-emitting unit, a heating unit, a sound unit, an electrochromic unit, a magnetic unit, or any combination thereof.

8. The method according to claim 6, wherein the electro-induced change element is a light-emitting unit, and the light-emitting unit is made by hands.

9. The method according to claim 8, wherein the light-emitting unit comprises:
   an electrical substrate electrically connected to the medium layer;
   a light-emitting diode electrically connected to the electrical substrate; and a flexible patch flatly attaching to or surrounding the electrical substrate and the light-emitting diode so that the electrical substrate and the light-emitting diode are electrically and firmly connected to each other.

10. The method according to claim 1, wherein the substrate is a wood substrate, a bamboo substrate, a paper substrate or a cotton substrate.

\* \* \* \* \*